(12) United States Patent
Nakagawa

(10) Patent No.: US 10,854,817 B2  
(45) Date of Patent: Dec. 1, 2020

(54) DISPLAY DEVICE AND METHOD OF MANUFACTURING DISPLAY DEVICE

(71) Applicant: Japan Display Inc., Minato-ku (JP)

(72) Inventor: Takuya Nakagawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/732,622

(22) Filed: Jan. 2, 2020

(65) Prior Publication Data

US 2020/0136044 A1 Apr. 30, 2020

Related U.S. Application Data

(63) Continuation of application No. 16/030,021, filed on Jul. 9, 2018, now Pat. No. 10,553,794.

(30) Foreign Application Priority Data

Jul. 13, 2017 (JP) ................. 2017-136972

(51) Int. Cl.
| | | |
|---|---|---|
| H01L 51/00 | (2006.01) | |
| H01L 51/56 | (2006.01) | |
| B29C 41/42 | (2006.01) | |
| H01L 27/32 | (2006.01) | |
| B29L 31/34 | (2006.01) | |
| B29C 41/08 | (2006.01) | |
| B29K 79/00 | (2006.01) | |
| H01L 51/52 | (2006.01) | |

(52) U.S. Cl.
CPC ............ *H01L 51/003* (2013.01); *B29C 41/42* (2013.01); *H01L 51/0097* (2013.01); *H01L 51/56* (2013.01); *B29C 41/08* (2013.01); *B29K 2079/08* (2013.01); *B29L 2031/3475* (2013.01); *H01L 27/3244* (2013.01); *H01L 51/5253* (2013.01); *H01L 2227/326* (2013.01); *H01L 2251/5338* (2013.01)

(58) Field of Classification Search
CPC . H01L 27/3244; H01L 51/0097; H01L 51/56; H01L 51/003; H01L 51/5253; H01L 2251/5338; B29K 2079/08; B29L 2031/3475

See application file for complete search history.

(56) References Cited

U.S. PATENT DOCUMENTS

| | | |
|---|---|---|
| 2011/0223697 A1 | 9/2011 | Yong-Hwan et al. |
| 2012/0050145 A1 | 3/2012 | Yasumatsu |
| 2015/0187849 A1* | 7/2015 | Kachatryan ............. H01L 51/56 257/40 |

FOREIGN PATENT DOCUMENTS

| | | |
|---|---|---|
| JP | 2011-187446 | 9/2011 |
| JP | 2013-235196 | 11/2013 |

\* cited by examiner

*Primary Examiner* — Jasmine J Clark  
(74) *Attorney, Agent, or Firm* — Oblon, McClelland, Maier & Neustadt, L.L.P.

(57) ABSTRACT

A method of manufacturing a display device according to an embodiment of the present invention includes in order: forming a sacrificial layer in a predetermined position on a substrate; forming a base material containing resin on the substrate with the sacrificial layer therebetween; forming a display region including a plurality of pixels on the base material; irradiating the substrate with laser light from a side of the substrate on which the base material is not formed; and peeling the substrate from the base material. A region where the base material and the substrate are in contact with each other is present at least a part of an edge portion of the base material.

11 Claims, 11 Drawing Sheets

DISPLAY DEVICE AND METHOD OF MANUFACTURING DISPLAY DEVICE

CROSS-REFERENCE TO RELATED APPLICATION

This application is a continuation of and claims the benefit of priority under 35 U.S.C. § 120 from U.S. application Ser. No. 16/030,021 filed Jul. 9, 2018 (now U.S. Pat. No. 10,553,794 issued Feb. 4, 2020), and claims the benefit of priority under 35 U.S.C. § 119 from Japanese Application No. 2017-136972 filed Jul. 13, 2017, the entire contents of each of which are incorporated herein by reference.

BACKGROUND OF THE INVENTION

1. Field of the Invention

One or more embodiments of the present invention relate to a flexible display device and a method of manufacturing a flexible display device.

2. Description of the Related Art

In a display device including a display region, such as an organic electroluminescent (EL) display device or a liquid crystal display device, the development of a flexible display in which a display panel can be bent has recently progressed with use of a base material having flexibility.

For example, as disclosed in JP 2011-187446 A, the base material having flexibility is supported on a substrate (e.g., a glass substrate) in a manufacturing process of the display panel from the viewpoint of handleability or the like, and the base material is peeled from the substrate at any proper timing.

SUMMARY OF THE INVENTION

The substrate is peeled, for example, after the force of adhesion between the base material and the substrate is reduced by irradiation with laser light. However, in a conveying process from the laser light irradiation to the peeling of the substrate, a failure such as the falling of the substrate may occur. Conveying the display panel in a state where the substrate is absent may cause the degradation (e.g., damage to the display panel or the adherence of a foreign substance thereto) of the quality of the display panel to be obtained.

One or more embodiments of the present invention have been made in view of the above, and an object thereof is to provide a method of manufacturing a display device in which the degradation of the quality of a display panel is suppressed.

According to one aspect of the present invention, a method of manufacturing display device is provided. The method of manufacturing a display device includes in order: forming a sacrificial layer in a predetermined position on a substrate; forming a base material containing resin on the substrate with the sacrificial layer therebetween; forming a display region including a plurality of pixels on the base material; irradiating the substrate with laser light from a side of the substrate on which the base material is not formed; and peeling the substrate from the base material. A region where the base material and the substrate are in contact with each other is present at at least a part of an edge portion of the base material.

According to another aspect of the present invention, a display device is provided. The display device includes: a base material having flexibility; and a plurality of pixels located on the base material. A major surface of the base material is a side opposite to a surface on which the plurality of pixels are formed, the major surface has a first area and a second area, a surface of the first area is rougher than that of the second area.

DETAILED DESCRIPTION OF THE INVENTION

Figure 1:
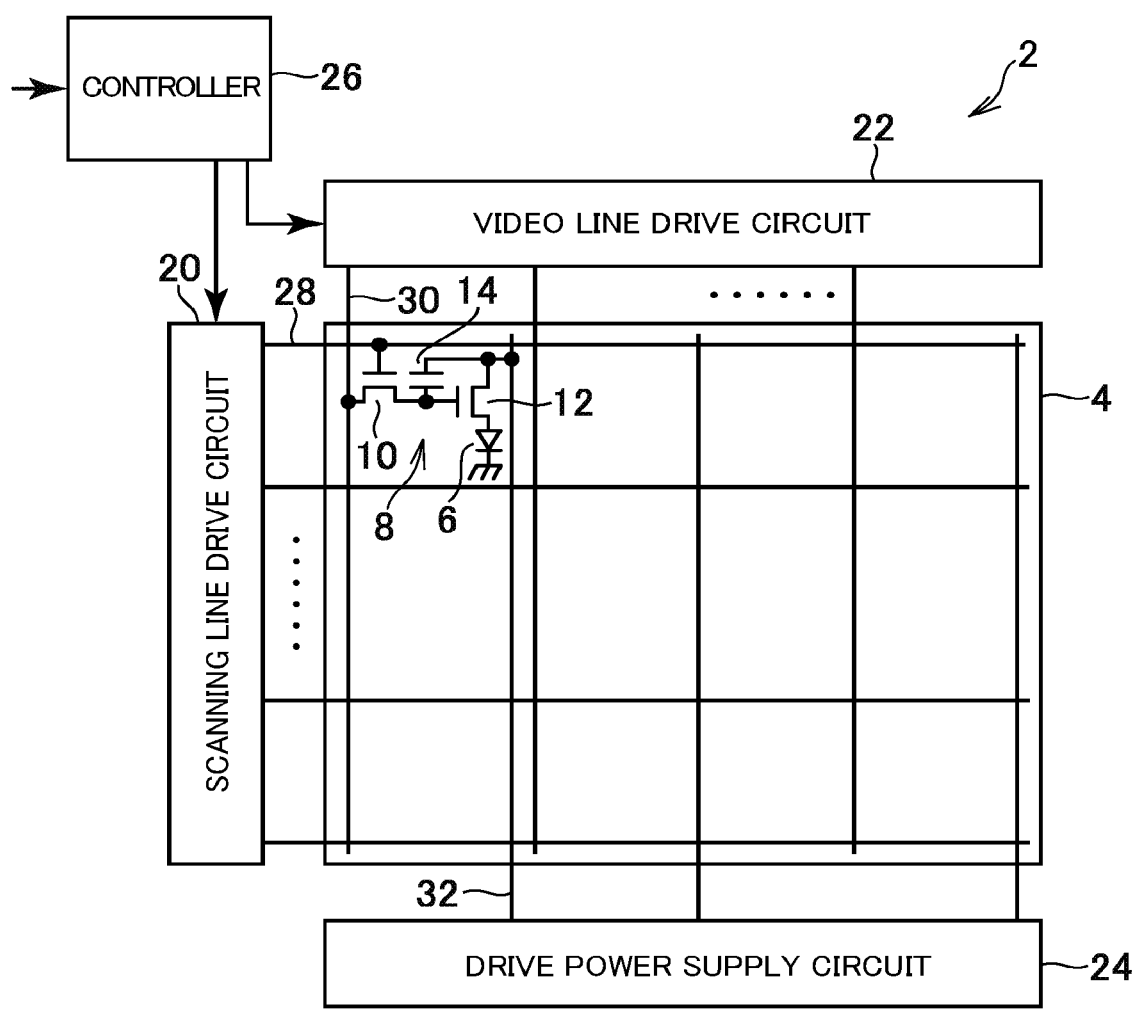
FIG. 1 is a schematic view showing a schematic configuration of an organic EL display device according to one embodiment of the invention.

Hereinafter, embodiments of the invention will be described with reference to the drawings. The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in practicing aspects of the invention. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

In the specification and the claims, when the term "on" is simply used in expressing the form in which one structure is disposed on another structure, the term "on" includes, unless otherwise noted, both the case where one structure is disposed directly on another structure so as to be in contact therewith and the case where one structure is disposed above another structure with still another structure therebetween. Moreover, when the term "below" is simply used, the term "below" includes, unless otherwise noted, both the case where one structure is disposed directly below another structure so as to be in contact therewith and the case where one structure is disposed below another structure with still another structure therebetween.

FIG. 1 is a schematic view showing a schematic configuration of a display device according to one embodiment of the invention, showing an organic EL display device as an example. An organic EL display device 2 includes a pixel array section 4 that displays an image, and a drive section that drives the pixel array section 4. The organic EL display device 2 is a flexible display using a resin film as a base material, and a stacked structure of a thin film transistor (TFT), an organic light emitting diode (OLED), and the like is formed on the base material composed of the resin film. The schematic view shown in FIG. 1 is one example only, and the embodiment is not limited to this example.

In the pixel array section 4, OLEDs 6 and pixel circuits 8 are disposed in a matrix so as to correspond to pixels. The pixel circuit 8 includes a plurality of TFTs 10 and 12 and a capacitor 14.

The drive section includes a scanning line drive circuit 20, a video line drive circuit 22, a drive power supply circuit 24, and a controller 26. The drive section drives the pixel circuit 8 and controls emission of the OLED 6.

The scanning line drive circuit 20 is connected to a scanning signal line 28 provided for each array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to a video signal line 30 provided for each array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies a current in response to the written voltage to the OLED 6, and thus the OLED 6 of the pixel corresponding to the selected scanning signal line 28 emits light.

The drive power supply circuit 24 is connected to a drive power supply line 32 provided for each pixel column, and supplies a current to the OLED 6 via the drive power supply line 32 and the drive TFT 12 in the selected pixel row.

Here, a lower electrode of the OLED 6 is connected to the drive TFT 12. On the other hand, upper electrodes of the OLEDs 6 are composed of an electrode common to the OLEDs 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
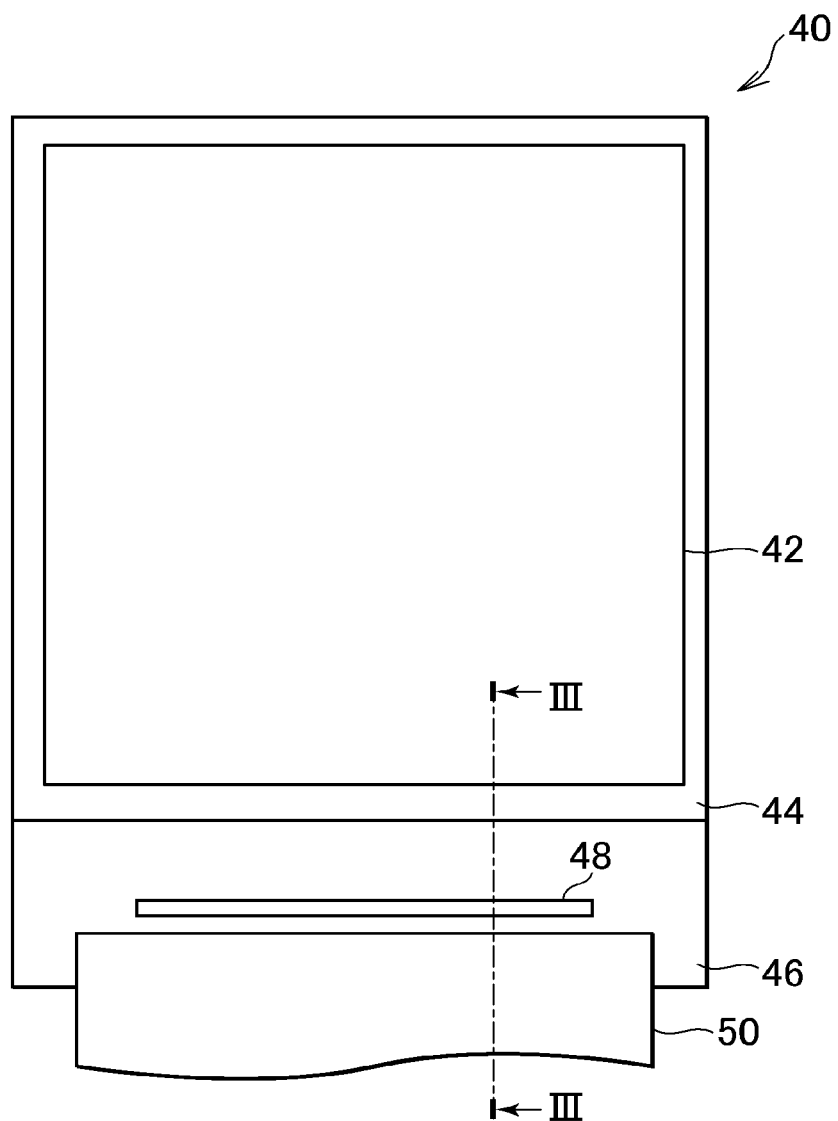
FIG. 2 is a schematic plan view showing one example of a display panel of the organic EL display device shown in FIG. 1.

FIG. 2 is a schematic plan view showing one example of a display panel of the organic EL display device shown in FIG. 1. The pixel array section 4 shown in FIG. 1 is provided in a display region 42 of the display panel 40, and the OLEDs 6 are arranged in the pixel array section 4 as described above. The upper electrode constituting the OLEDs 6 is formed common to the pixels as described above, and covers the entire display region 42.

A component mounting region 46 is provided at one edge side of the display panel 40 having a rectangular shape, and wiring line connecting to the display region 42 is disposed at the edge side. A driver IC 48 constituting the drive section is mounted on the component mounting region 46, and a flexible printed board (FPC) 50 is connected thereto. The FPC 50 is connected to the controller 26, the circuits 20, 22, and 24, and the like, and an IC is mounted on the FPC 50.

Figure 3:
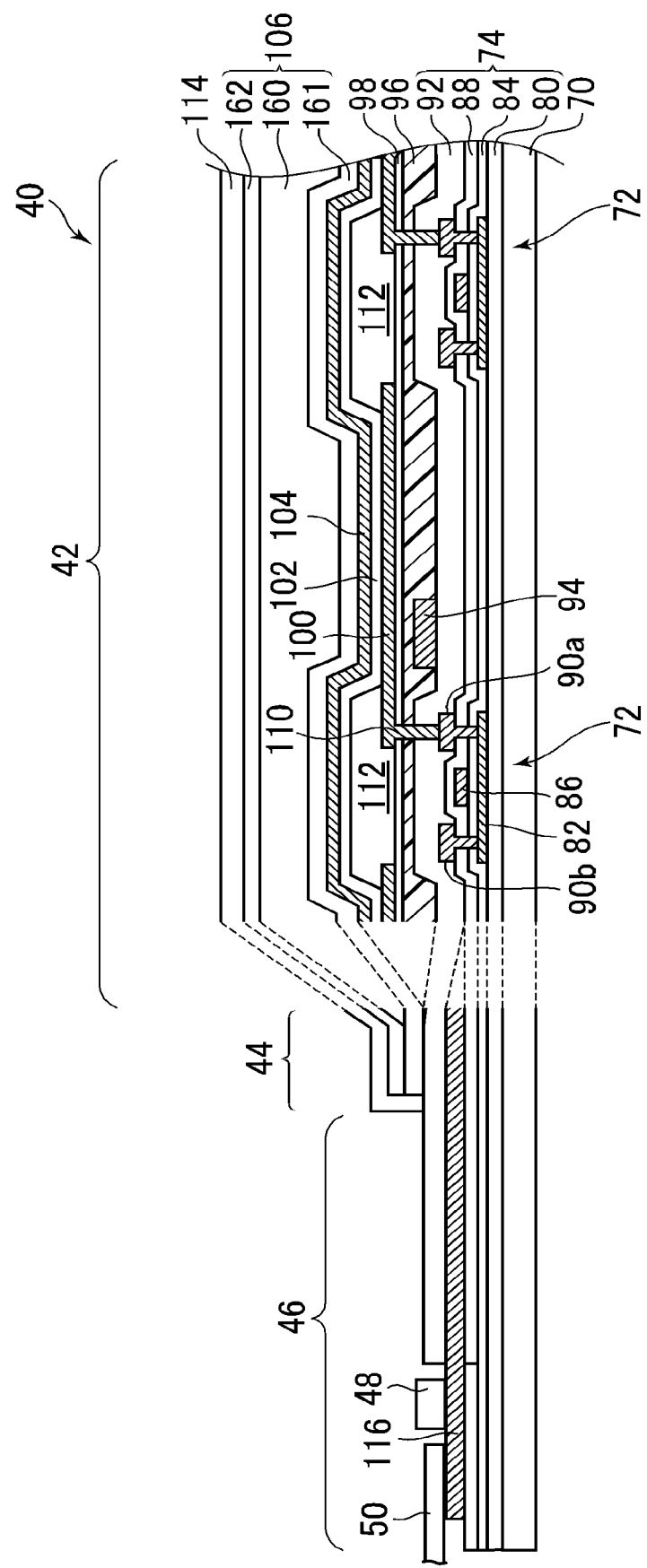
FIG. 3 is a diagram showing one example of a cross section along line III-III in FIG. 2.

FIG. 3 is a diagram showing one example of a cross section along line III-III in FIG. 2. The display panel 40 has, for example, a structure in which a circuit layer 74 including TFTs 72 formed therein, the OLEDs 6, a sealing layer 106 sealing the OLEDs 6, and the like are stacked on a base material 70 composed of a resin film and having flexibility. Examples of the resin constituting the base material 70 include, for example, a polyimide-based resin. The base material 70 is formed by, for example, depositing a resin film containing a resin material such as polyimide by applying. A protective film 114 is stacked on the sealing layer 106. Specifically, the protective film 114 in a sheet form or a film form is bonded on the sealing layer 106 with an adhesion layer therebetween. In the embodiment, the pixel array section 4 is of a top-emission type, and light generated in the OLED 6 is emitted to the side (upward in FIG. 3) opposite to the base material 70 side. When a color filter system is employed as a coloring system in the organic EL display device 2, a color filter is disposed, for example, between the sealing layer 106 and the protective film 114, or on a counter substrate (not shown) side. White light generated by the OLED 6 transmits through the color filter, so that, for example, pixels emit red (R), green (G), and blue (B) lights.

The pixel circuit 8, the scanning signal line 28, the video signal line 30, the drive power supply line 32, and the like, which are described above, are formed in the circuit layer 74 in the display region 42. At least a portion of the drive section can be formed as the circuit layer 74 on the base material 70 in a region adjacent to the display region 42. As described above, the driver IC 48 constituting the drive section and the FPC 50 can be connected to a wiring line 116 of the circuit layer 74 in the component mounting region 46.

As shown in FIG. 3, an under layer 80 formed of an inorganic insulating material is disposed on the base material 70. As the inorganic insulating material, for example, silicon nitride ($SiN_y$), silicon oxide ($SiO_x$), and a complex of $SiN_y$ and $SiO_x$ are used.

In the display region 42, a semiconductor region 82 serving as a channel section and a source-drain section of the TFT 72 of a top-gate type is formed on the base material 70 with the under layer 80 between the semiconductor region 82 and the base material 70. The semiconductor region 82 is formed of, for example, polysilicon (p-Si). The semiconductor region 82 is formed by, for example, providing a semiconductor layer (p-Si film) on the base material 70, and patterning the semiconductor layer to selectively leave an area serving as the circuit layer 74.

A gate electrode 86 is disposed on the channel section of the TFT 72 with a gate insulating film 84 therebetween. The gate insulating film 84 is typically formed of TEOS. The gate electrode 86 is formed by, for example, patterning a metal film formed by sputtering or the like. An interlayer insulating layer 88 is disposed on the gate electrode 86 so as to cover the gate electrode 86. The interlayer insulating layer 88 is formed of, for example, the above inorganic insulating material. An impurity is introduced by ion implantation into the semiconductor region 82 (p-Si) serving as the source-drain section of the TFT 72. Further, a source electrode 90a and a drain electrode 90b that are electrically connected to the source-drain section are formed, so that the TFT 72 is configured.

An interlayer insulating film 92 is disposed on the TFT 72. A wiring 94 is disposed on the surface of the interlayer insulating film 92. The wiring 94 is formed by, for example, patterning a metal film formed by sputtering or the like. For example, the scanning signal line 28, the video signal line 30, and the drive power supply line 32, which are shown in FIG. 1, and the wiring 116 can be formed to have a multilayer wiring structure using the metal film forming the wiring 94 and the metal film used for forming the gate electrode 86, the source electrode 90a, and the drain electrode 90b. On this configuration, a planarization film 96 and a passivation film 98 are formed. The OLED 6 is formed on the passivation film 98 in the display region 42. The planarization film 96 is formed of, for example, a resin material. The passivation film 98 is formed of, for example, an inorganic insulating material such as $SiN_y$.

The OLED 6 includes a lower electrode 100, an organic material layer 102, and an upper electrode 104. Specifically, the organic material layer 102 includes a hole transport layer, a light emitting layer, and an electron transport layer. The OLED 6 is typically formed by stacking the lower electrode 100, the organic material layer 102, and the upper electrode 104 in this order from the base material 70 side. In the embodiment, the lower electrode 100 is an anode of the OLED 6, and the upper electrode 104 is a cathode thereof.

When the TFT 72 shown in FIG. 3 is the drive TFT 12 having an n-channel, the lower electrode 100 is connected to the source electrode 90a of the TFT 72. Specifically, after the formation of the planarization film 96 described above, a contact hole 110 for connecting the lower electrode 100 to the TFT 72 is formed. And for example, by patterning a conductor portion formed on the surface of the planarization film 96 and inside the contact hole 110, the lower electrode 100 connected to the TFT 72 is formed for each pixel. The lower electrode is formed of, for example, a transmitting conductive material such as indium tin oxide (ITO) or indium zinc oxide (IZO), or metal such as Ag or Al.

On this structure, a rib 112 separating the pixels is disposed. For example, after the formation of the lower electrode 100, the rib 112 is formed at the boundary between the pixels, and the organic material layer 102 and the upper electrode 104 are stacked in an effective region (a region where the lower electrode 100 is exposed) of the pixel surrounded by the rib 112. The upper electrode 104 is formed of, for example, an extremely thin alloy of Mg and Ag, or a transmitting conductive material such as ITO or IZO.

The sealing layer 106 is disposed on the upper electrode 104 so as to cover the entire display region 42. The sealing layer 106 has a stacked structure including a first sealing film 161, a sealing planarization film 160, and a second sealing film 162 in this order. The first sealing film 161 and the second sealing film 162 are formed of an inorganic material (e.g., an inorganic insulating material). Specifically, the first sealing film 161 and the second sealing film 162 are formed by depositing a $SiN_y$ film by a chemical vapor deposition (CVD) method. The sealing planarization film 160 is formed using an organic material (e.g., a resin material such as a curable resin composition). On the other hand, the sealing layer 106 is not disposed in the component mounting region 46.

For example, for ensuring the mechanical strength of the surface of the display panel 40, the protective film 114 is stacked on the surface of the display region 42. On the other hand, the protective film 114 is not provided in the component mounting region 46 for facilitating connection of the IC or the FPC.

A method of manufacturing an organic EL display device in a first embodiment of the invention will be described with reference to FIGS. 4A to 4D and FIGS. 5A and 5B. In FIGS. 4A to 4D, the structures in FIG. 3 are simply shown as a three-layer structure of the base material 70, an upper structure layer 108, and the protective film 114. In FIGS. 5A and 5B, the upper structure layer 108 and the protective film 114 are omitted, and further, the base material 70 is omitted in FIG. 5A.

Figure 4A:
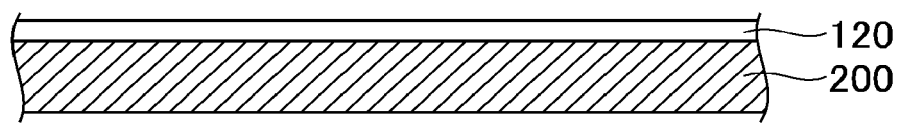
FIG. 4A is a diagram for explaining a method of manufacturing an organic EL display device in a first embodiment of the invention.
Figure 5A:
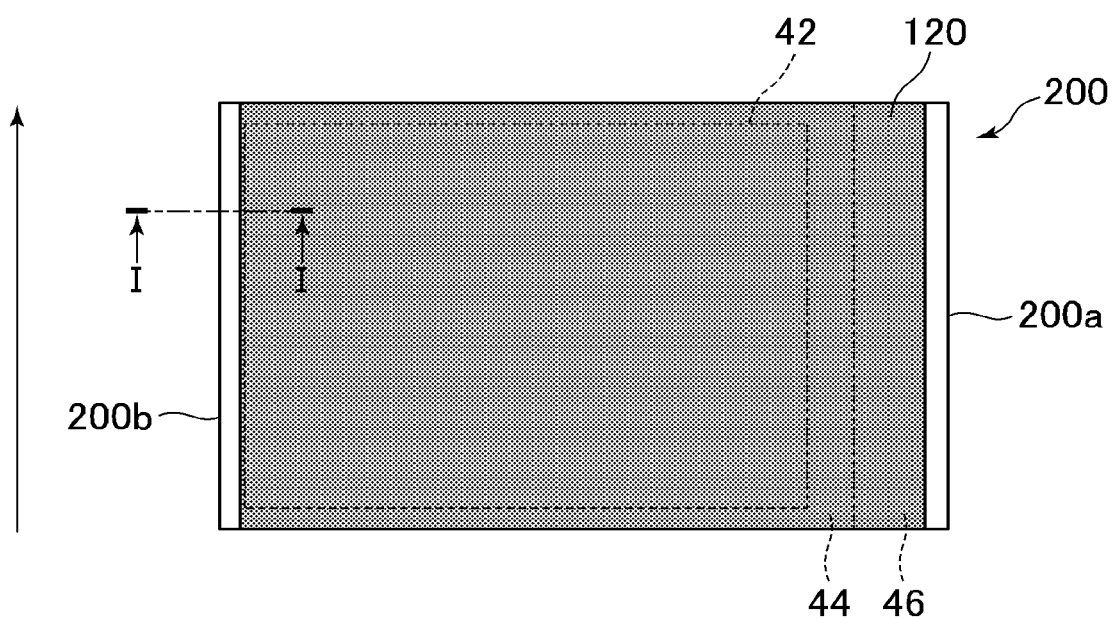
FIG. 5A is a plan view showing the forming region of a sacrificial layer in the first embodiment of the invention.
Figure 5B:
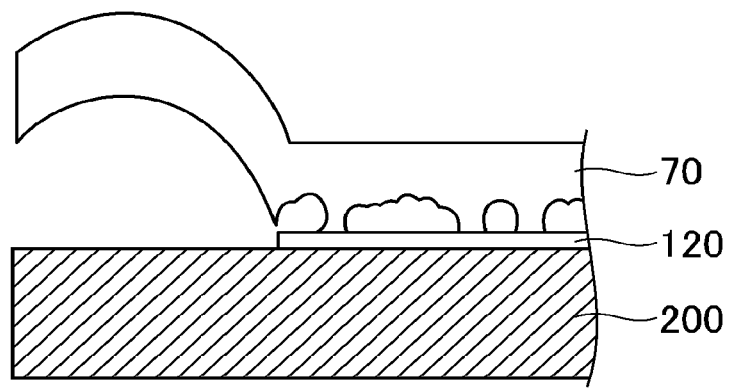
FIG. 5B is a diagram showing one example of a cross section along line I-I in FIG. 5A after laser light irradiation.

First, as shown in FIG. 4A, a sacrificial layer 120 having a desired thickness (e.g., approximately 10 μm) is formed on a glass substrate 200 (also referred to as "substrate" or "support substrate"). The sacrificial layer 120 blocks a part of laser light to be described later. Specifically, as shown in FIG. 5A, the sacrificial layer 120 is formed in a region except for one edge side 200a of the glass substrate 200 having a rectangular shape on the component mounting region 46 side and one edge side 200b opposing the component mounting region 46. In the example shown in the drawing, the sacrificial layer 120 is formed in a region except for the entire lengths of the edge side 200a and the edge side 200b. However, for example, the sacrificial layer 120 may be formed at a part (parts) of the edge side 200a and/or the edge side 200b. Here, it is preferable to continuously form the sacrificial layer 120 in a region corresponding to the display region 42 and a frame region 44 surrounding the display region 42. This is because if there is a region where the sacrificial layer 120 is not present in the display region 42, for example the uniformity in the quality (surface property) of the display panel to be obtained may be reduced. Specifically, in laser light irradiation to be described later, laser light may directly act on the base material 70 in the region where the sacrificial layer 120 is not present. As a result, the surface of the base material 70 may be roughened in the region where the sacrificial layer 120 is not present, compared to a region where the sacrificial layer 120 is present. The difference in surface roughness can be observed by, for example, SEM (Scanning Electron Microscope) observation.

The sacrificial layer 120 is formed of a material that can absorb laser light to be described later. The laser light transmittance of the sacrificial layer 120 is typically from 0% to 99%. As the forming material of the sacrificial layer 120, for example, silicon nitride ($SiN_y$), silicon oxide ($SiO_x$), a complex of $SiN_y$ and $SiO_x$, silicon, metal, or the like is used. By appropriately selecting the forming material or thickness, it is possible to form the sacrificial layer 120 satisfying a desired transmittance or the close adhesion state to the base material 70 after laser light irradiation to be described later. The transmittance of the sacrificial layer 120 or the close adhesion state thereof to the base material 70 after laser light irradiation is adjusted according to, for example, the forming region of the sacrificial layer 120. Specifically, in the embodiment in which the sacrificial layer 120 is formed so as to cover the display region 42, for example, the close adhesion state of the sacrificial layer 120 and the base material 70 after laser light irradiation to be described later is adjusted to such an extent that the sacrificial layer 120 and the base material 70 are not completely peeled from each other. Specifically, the sacrificial layer 120 is formed of silicon nitride ($SiN_y$) with a laser light transmittance of 70% to 99%, and the surface of the base material 70 can be directly ablated by laser light irradiation.

Figure 4B:
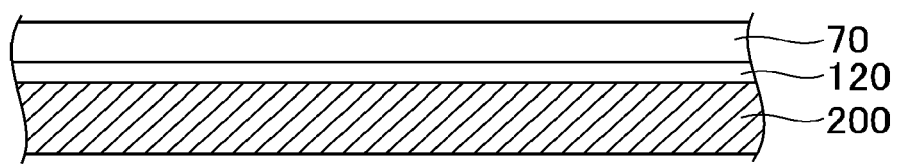
FIG. 4B is a diagram for explaining the method of manufacturing the organic EL display device in the first embodiment of the invention.

Next, as shown in FIG. 4B, the base material 70 including the display region 42, the frame region 44, and the component mounting region 46 is formed on the glass substrate 200. Specifically, the forming material (e.g., a resin composition) of the base material 70 is applied on the glass substrate 200 on the side on which the sacrificial layer 120 is formed, and the forming material is subjected to various treatments such as heating as necessary, so that the base material 70 having a desired thickness (e.g., approximately 20 μm) is formed. As the applying method of forming material of the base material 70, a publicly known method such as a spin-coating method can be employed.

In the embodiment, a region where the base material 70 and the glass substrate 200 are in contact with each other is present at the edge side 200*a* and the edge side 200*b*. In this manner, a place where the sacrificial layer 120 is missing is present at the outer edge of the base material 70 (the sacrificial layer 120 is not formed in a frame shape corresponding to the outer edge of the base material 70), and therefore, the missing portion can function as an escape hole of gas generated from the base material 70 by laser light irradiation to be described later. As a result, for example, the degradation of the quality of the display panel to be obtained can be prevented.

Figure 4C:
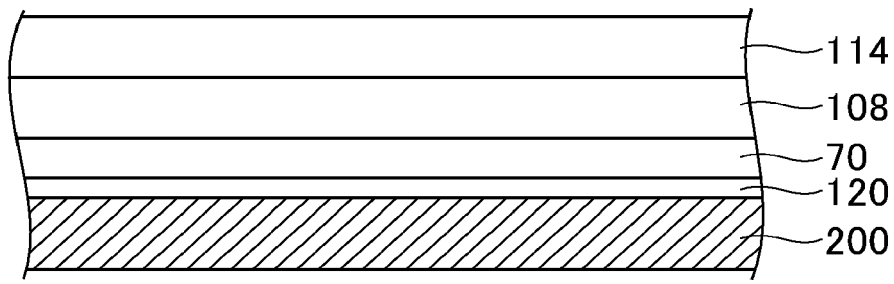
FIG. 4C is a diagram for explaining the method of manufacturing the organic EL display device in the first embodiment of the invention.

Next, as shown in FIG. 4C, the circuit layer 74 including the TFT 72, the planarization film 96, the passivation film 98, the OLED 6, and the sealing layer 106 are formed in this order on the base material 70 to form the upper structure layer 108, and thereafter, the protective film 114 (e.g., a resin film such as a PET film) is stacked on the upper structure layer 108 using an adhesive. The frame region 44 differs from the display region 42 in that, for example, the frame region 44 does not include the TFT 72 and the OLED 6.

Figure 4D:
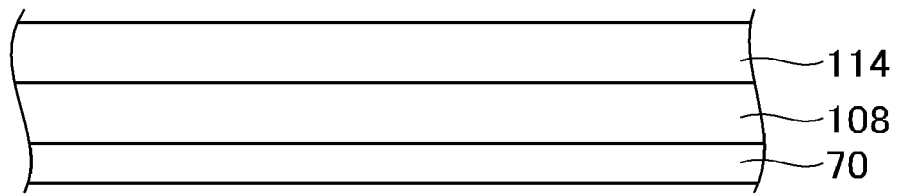
FIG. 4D is a diagram for explaining the method of manufacturing the organic EL display device in the first embodiment of the invention.

Next, as shown in FIG. 4D, the glass substrate 200 is peeled from the base material 70. Here, the sacrificial layer 120 adheres to the glass substrate 200 side. Unlike the example shown in the drawing, the glass substrate 200 may be peeled before the protective film 114 is stacked on the upper structure layer 108.

The glass substrate 200 is peeled by, for example, irradiation with laser light (e.g., using an excimer laser) to reduce the adhesion property between the glass substrate 200 and the base material 70. For example, laser light having a proper wavelength is selected according to the material (materials) of the substrate and/or the base material. Specifically, laser light having a wavelength that transmits through the substrate (substantially a transmittance 100%) and can reduce the adhesion property between the substrate and the base material is selected. Moreover, by properly selecting laser light, it is possible to control the transmittance of the sacrificial layer 120 or the close adhesion state thereof to the base material 70 after laser light irradiation.

Laser light irradiation is performed by scanning with a laser light source from the side of the glass substrate 200 on which the base material 70 (the sacrificial layer 120) is not formed. For example, a laser light source corresponding to the long edge side of the display region is caused to perform scanning along the direction of arrow shown in FIG. 5A.

FIG. 5B is a diagram showing one example of a cross section along line I-I in FIG. 5A after laser light irradiation. After laser light irradiation, the force of adhesion between the glass substrate 200 and the base material 70 is reduced in the region where the sacrificial layer 120 is not formed, and the glass substrate 200 is peeled from the base material 70. On the other hand, in the region where the sacrificial layer 120 is formed, the glass substrate 200 is in a state of closely adhering partially to the base material 70 (low close-adhesion state). Hence, the glass substrate 200 can be mechanically peeled from the base material 70 by cramping and pulling the both edge portions of the base material 70 located on the two opposing edge sides 200*a* and 200*b* of the glass substrate 200 and peeled from the glass substrate 200. In this manner, the glass substrate 200 partially adheres to the base material 70 immediately after laser irradiation, and therefore, the falling of the glass substrate 200 is prevented. Moreover, the glass substrate 200 can be peeled at proper timing, and therefore, the conveyability of the display panel immediately after laser irradiation can also be ensured. As a result, damage to the display panel or the adherence of a foreign substance thereto can be suppressed, and the display panel with excellent quality can be obtained.

In the display panel obtained by peeling the glass substrate 200, an area whose surface is rougher than that of the other area is formed at the opposing short edge sides on a major surface of the base material 70 on the side on which the upper structure layer 108 is not formed.

Figure 6:
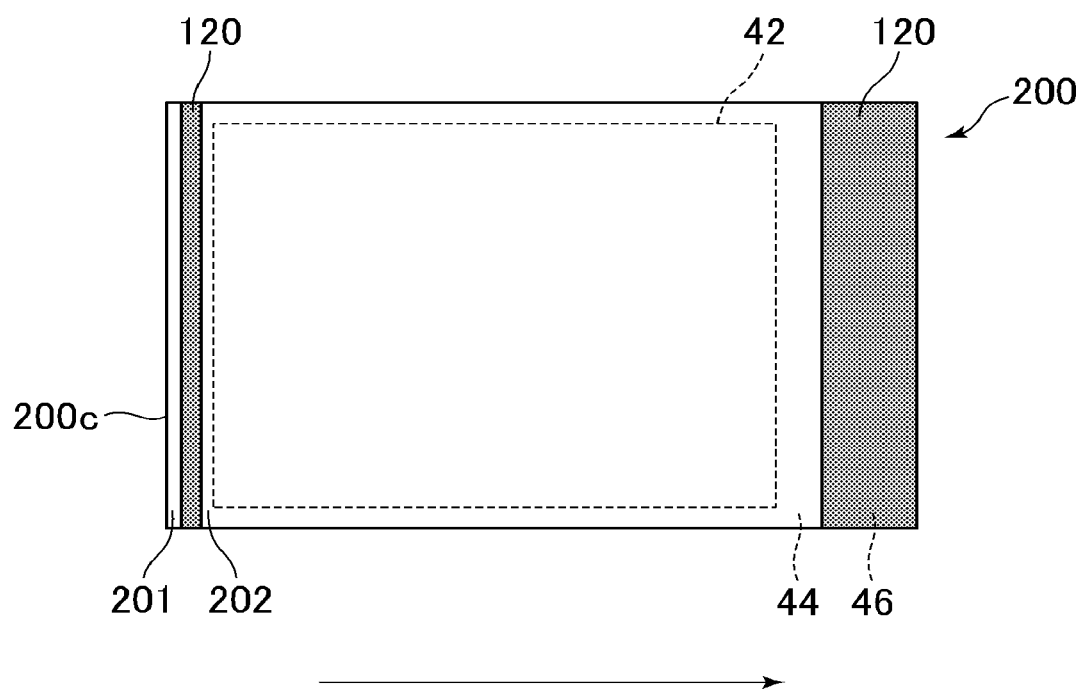
FIG. 6 is a plan view showing the forming region of a sacrificial layer in a second embodiment of the invention.

FIG. 6 is a plan view showing the forming region of a sacrificial layer in a second embodiment of the invention. In the second embodiment, an organic EL display device is manufactured in the same manner as in the first embodiment, except that the forming region of the sacrificial layer is changed.

In the second embodiment, the sacrificial layer 120 is formed at an edge portion (a region corresponding to the component mounting region 46) of the rectangular glass substrate 200 on the component mounting region 46 side and an edge portion on the side opposite to the component mounting region 46, while the sacrificial layer 120 is not formed in a region corresponding to the display region 42. The sacrificial layer 120 is formed spaced apart from an edge 200*c* of the glass substrate 200 at the edge portion on the side opposite to the component mounting region 46. Specifically, a first region 201 where the base material 70 and the glass substrate 200 are in contact with each other, a region where the sacrificial layer 120 is present, and a second region 202 where the base material 70 and the glass substrate 200 are in contact with each other are disposed in this order from the edge of the base material 70. By forming the first region 201, the edge portion of the base material 70 can be cramped after laser light irradiation in the same manner as in the first embodiment. In the example shown in the drawing, the second region 202 includes the display region 42, and the sacrificial layer 120 is disposed spaced apart from the display region 42. However, the sacrificial layer 120 may be disposed adjacent to the display region 42. Here, it is preferable that a part of the sacrificial layer 120 does not overlap the display region 42. This is because if the sacrificial layer 120 is present in the display region 42, for example the uniformity in the quality (surface property) of the display panel to be obtained may be reduced.

When the sacrificial layer 120 is not disposed in the display region 42 as in the embodiment, it is preferable, as shown in the drawing, to form the sacrificial layer 120 along a direction crossing the peeling direction (the direction of arrow shown in FIG. 6) of the base material 70 (display panel). It is further preferable to form the sacrificial layer 120 in a direction substantially orthogonal to the peeling direction. This is because if the sacrificial layer 120 is formed along the peeling direction, cracks may occur in the display region 42 in peeling. In the example shown in the drawing, the sacrificial layer 120 is continuously formed in the short-edge-side direction of the rectangular glass substrate 200. However, the sacrificial layer 120 may be intermittently formed.

Also in the embodiment, any proper configuration that can absorb laser light can be employed for the sacrificial layer 120. For example, the sacrificial layer 120 is formed of amorphous silicon. In this case, the sacrificial layer 120 can absorb almost laser light (transmittance being substantially 0%). Amorphous silicon generates heat by laser light irradiation, is crystallized with the heat, and can expand in volume. As a result, the low close-adhesion state in which the base material 70 is partially peeled from the sacrificial layer 120 can be obtained.

In the embodiment, in the display panel obtained by peeling the glass substrate 200, an area whose surface is rougher than that of the other area is formed so as to cover the display region 42 on a major surface of the base material 70 on the side on which the upper structure layer 108 is not formed.

Figure 7:
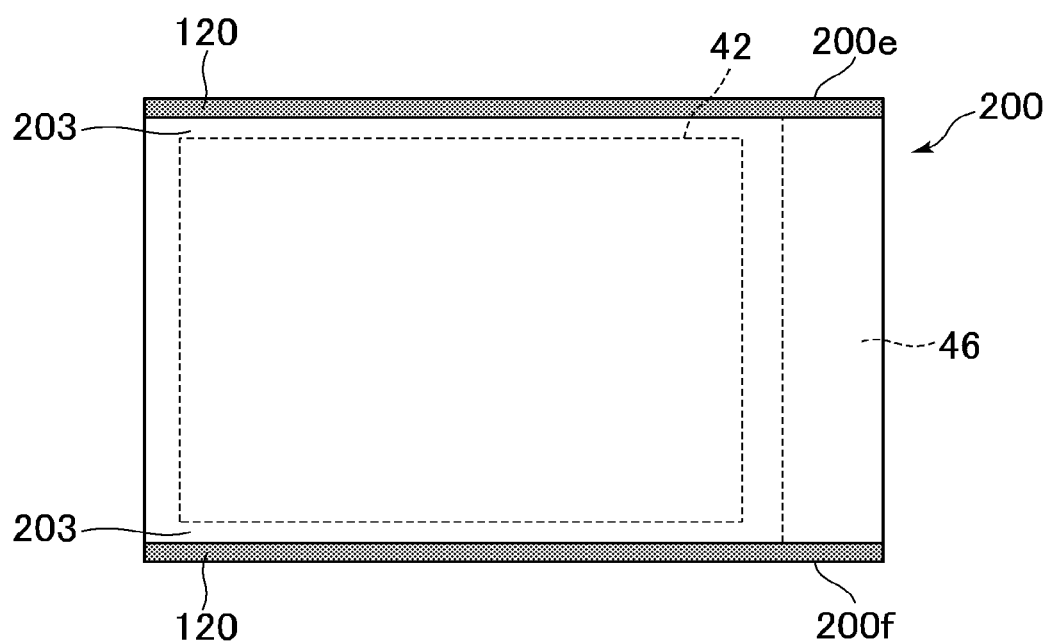
FIG. 7 is a plan view showing the forming region of a sacrificial layer in a third embodiment of the invention.

FIG. 7 is a plan view showing the forming region of a sacrificial layer in a third embodiment of the invention. In the third embodiment, an organic EL display device is manufactured in the same manner as in the first embodiment, except that the forming region of the sacrificial layer is changed.

In the third embodiment, the sacrificial layer 120 is formed at two opposing edge sides (long edge sides) 200e and 200f of the rectangular glass substrate 200, while the sacrificial layer 120 is not disposed in the display region 42. The sacrificial layer 120 is formed so as to have a predetermined width from the edge of the glass substrate 200. In this manner, the sacrificial layer 120 is disposed at least apart (long edge side) of the outer edge of the base material 70. In the example shown in the drawing, the sacrificial layer 120 is formed spaced apart from a region corresponding to the display region 42. Specifically, a third region 203 where the base material 70 and the glass substrate 200 are in contact with each other is disposed between the display region 42 and the sacrificial layer 120. In the example shown in the drawing, the sacrificial layer 120 is continuously formed in the long-edge-side direction of the rectangular glass substrate 200. However, the sacrificial layer 120 may be intermittently formed.

Also when the sacrificial layer 120 is not disposed in the display region 42 as in the embodiment, any proper form that can absorb laser light can be employed for the sacrificial layer 120. For example, the sacrificial layer 120 is composed of a metal layer containing metal. In this case, the sacrificial layer 120 does not transmit laser light (transmittance being substantially 0%), and thus the adhesion property between the base material 70 and the sacrificial layer 120 cannot be greatly changed by laser light irradiation. Therefore, after the edge portion at which the sacrificial layer 120 is formed is removed by cutting (e.g., cutting by laser light irradiation) after laser light irradiation, the glass substrate 200 and the base material 70 can be easily separated by picking up or the like.

The invention is not limited to the embodiments, but various modifications can be made. For example, the configuration shown in the embodiments may be replaced with substantially the same configuration, a configuration providing the same operational effect, or a configuration capable of achieving the same object. For example, instead of a form in which the substrate is peeled after being divided into individual panels (single pieces) as in the embodiment, a form in which the substrate is peeled from the base material before singulation may be employed.

Various altered and modified examples within the range of the idea of the invention will occur to those skilled in the art, and it is understood that the altered and modified examples also belong to the scope of the invention. For example, when those skilled in the art appropriately add or remove components or change the designs of components in the embodiments described above, or add or omit processes or change the conditions of processes in the embodiments described above, such variations are included in the scope of the invention as long as they include the spirit of the invention.

What is claimed is:

1. A flexible display device comprising:
   a flexible base material including a first surface and a second surface opposite to the first surface; and
   a thin film transistor on the first surface, wherein
   the second surface has a first area and a second area,
   the first area of the second surface having been irradiated with laser light via a sacrificial layer,
   the second area of the second surface having been irradiated with laser light which has not passed through the sacrificial layer, and
   the second surface within the second area being rougher than the second surface within the first area as observed by SEM observation.

2. The flexible display device according to claim 1, wherein
   the flexible base material includes a first outermost edge and a second outermost edge,
   the first outermost edge is disposed spaced apart from the second outermost edge, and
   the first outermost edge and the second outermost edge are disposed adjacent to the first area.

3. The flexible display device according to claim 2, wherein the first outermost edge and the second outermost edge are straight.

4. The flexible display device according to claim 1, further comprising a display region and a frame region surrounding the display region, wherein
   the first area overlaps the frame region in a plan view.

5. The flexible display device according to claim 4, wherein
   the second area overlaps the display region in a plan view.

6. The flexible display device according to claim 4, further comprising a component mounting region, wherein
   the first area overlaps the component mounting region in a plan view.

7. The flexible display device according to claim 6, wherein
   the component mounting region is in the frame region.

8. The flexible display device according to claim 1, further comprising a display region and a frame region surrounding the display region, wherein
   the first area overlaps the display region in a plan view.

9. The flexible display device according to claim 8, wherein
   the display region is between the first outermost edge and the second outermost edge.

10. The flexible display device according to claim 8, wherein
    the second area overlaps the frame region in a plan view.

11. The flexible display device according to claim 8, further comprising a component mounting region, wherein
    the first area overlaps the component mounting region in a plan view.

* * * * *